(12) United States Patent
Koga

(10) Patent No.: US 10,256,338 B2
(45) Date of Patent: Apr. 9, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventor: Takeharu Koga, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 1 day.

(21) Appl. No.: 15/800,870

(22) Filed: Nov. 1, 2017

(65) Prior Publication Data

US 2018/0158946 A1    Jun. 7, 2018

(30) Foreign Application Priority Data

Dec. 2, 2016 (JP) .................. 2016-235388

(51) Int. Cl.

| H01L 21/02 | (2006.01) |
|---|---|
| H01L 21/04 | (2006.01) |
| H01L 29/06 | (2006.01) |
| H01L 29/08 | (2006.01) |
| H01L 29/10 | (2006.01) |
| H01L 29/16 | (2006.01) |
| H01L 29/36 | (2006.01) |
| H01L 29/66 | (2006.01) |

(Continued)

(52) U.S. Cl.
CPC ...... *H01L 29/7813* (2013.01); *H01L 29/0623* (2013.01); *H01L 29/0878* (2013.01); *H01L 29/1095* (2013.01); *H01L 29/1608* (2013.01); *H01L 29/36* (2013.01); *H01L 29/66068* (2013.01); *H01L 29/66734* (2013.01); *H01L 29/7393* (2013.01); *H01L 21/0274* (2013.01); *H01L 21/02378* (2013.01); *H01L 21/02529* (2013.01); *H01L 21/02634* (2013.01); *H01L 21/0465* (2013.01); *H01L 29/0615* (2013.01); *H01L 29/0696* (2013.01); *H01L 29/086* (2013.01); *H01L 29/0882* (2013.01); *H01L 29/167* (2013.01); *H01L 29/42372* (2013.01); *H01L 29/7397* (2013.01)

(58) Field of Classification Search
None
See application file for complete search history.

(56) References Cited

U.S. PATENT DOCUMENTS 6,180,966 B1 * 1/2001 Kohno ............... H01L 29/7397
257/173
6,674,126 B2 * 1/2004 Iwamoto ............ H01L 29/7802
257/341

(Continued)

FOREIGN PATENT DOCUMENTS

| JP | 2011-192822 A | 9/2011 |
| JP | 2013-201266 A | 10/2013 |

*Primary Examiner* — David E Graybill
(74) *Attorney, Agent, or Firm* — Rabin & Berdo, P.C.

(57) ABSTRACT

A semiconductor device includes a semiconductor substrate, a first epitaxial layer of a first conductivity type, a first semiconductor region of the first conductivity type, a second epitaxial layer of a second conductivity type, a second semiconductor region of the first conductivity type, a gate insulating film, a gate electrode, an interlayer insulating film, a source electrode; and a gate electrode pad. The first semiconductor region is not provided beneath the gate electrode pad.

4 Claims, 10 Drawing Sheets

(51) Int. Cl.
- *H01L 29/78* (2006.01)
- *H01L 21/027* (2006.01)
- *H01L 29/167* (2006.01)
- *H01L 29/423* (2006.01)
- *H01L 29/739* (2006.01)

(56) References Cited

U.S. PATENT DOCUMENTS

| | | | | |
|---|---|---|---|---|
| 7,429,768 B2* | 9/2008 | Kobayashi | H01L 29/0696 | 257/328 |
| 7,470,952 B2* | 12/2008 | Ruething | H01L 29/0834 | 257/327 |
| 7,964,911 B2* | 6/2011 | Kitabatake | H01L 24/06 | 257/328 |
| 8,049,223 B2* | 11/2011 | Shimizu | H01L 27/0605 | 257/256 |
| 8,492,836 B2* | 7/2013 | Miura | H01L 29/1095 | 257/328 |
| 8,723,259 B2* | 5/2014 | Nakao | H01L 21/0465 | 257/241 |
| 8,816,410 B2* | 8/2014 | Saito | H01L 29/1095 | 257/288 |
| 8,860,039 B2* | 10/2014 | Miura | H01L 29/0615 | 257/77 |
| 8,872,257 B1* | 10/2014 | Matsuoka | H01L 29/7815 | 257/328 |
| 8,969,960 B2* | 3/2015 | Furukawa | H01L 29/66068 | 257/329 |
| 9,006,819 B2* | 4/2015 | Hino | H01L 29/1095 | 257/328 |
| 9,082,842 B2* | 7/2015 | Hirabayashi | H01L 29/7397 | |
| 9,093,361 B2* | 7/2015 | Hino | H01L 29/45 | |
| 9,105,715 B2* | 8/2015 | Miura | H01L 29/4916 | |
| 9,190,468 B2* | 11/2015 | Hino | H01L 29/7396 | |
| 9,257,501 B2* | 2/2016 | Takaya | H01L 29/42372 | |
| 9,293,572 B2* | 3/2016 | Furukawa | H01L 29/7805 | |
| 9,362,393 B2* | 6/2016 | Sakata | H01L 29/4238 | |
| 9,396,946 B2* | 7/2016 | Dhar | H01L 21/049 | |
| 9,431,530 B2* | 8/2016 | Xu | H01L 29/7813 | |
| 9,450,060 B2* | 9/2016 | Hiyoshi | H01L 29/402 | |
| 9,536,997 B1* | 1/2017 | Yokoyama | H01L 29/407 | |
| 9,577,054 B2* | 2/2017 | Hara | H01L 29/404 | |
| 9,620,595 B2* | 4/2017 | Shimatou | H01L 29/0634 | |
| 9,627,486 B2* | 4/2017 | Iwamuro | H01L 29/1608 | |
| 9,627,525 B2* | 4/2017 | Hiyoshi | H01L 29/47 | |
| 9,691,859 B2* | 6/2017 | Hiyoshi | H01L 29/872 | |
| 9,806,186 B2* | 10/2017 | Harrington, III | H01L 29/7811 | |
| 9,812,528 B2* | 11/2017 | Kono | H01L 29/1608 | |
| 9,831,316 B2* | 11/2017 | Inoue | H01L 29/42372 | |
| 9,865,591 B2* | 1/2018 | Horikawa | H01L 29/78 | |
| 9,893,055 B2* | 2/2018 | Ishii | H01L 21/76 | |
| 9,941,269 B2* | 4/2018 | Nakamura | H01L 29/404 | |
| 9,947,639 B2* | 4/2018 | Sawada | H01L 23/48 | |
| 9,960,267 B2* | 5/2018 | Miyakoshi | H01L 29/42372 | |
| 9,966,334 B2* | 5/2018 | Sawada | H01L 23/48 | |
| 10,026,832 B2* | 7/2018 | Nakamura | H01L 29/404 | |
| 10,056,370 B2* | 8/2018 | Naito | H01L 27/0664 | |
| 10,062,758 B2* | 8/2018 | Miura | H01L 29/0615 | |
| 2002/0167020 A1* | 11/2002 | Iwamoto | H01L 29/7802 | 257/110 |
| 2005/0139873 A1* | 6/2005 | Kobayashi | H01L 29/0696 | 257/288 |
| 2007/0120181 A1* | 5/2007 | Ruething | H01L 29/0834 | 257/328 |
| 2008/0079078 A1* | 4/2008 | Noguchi | H01L 29/7804 | 257/355 |
| 2008/0142799 A1* | 6/2008 | Kaneko | H01L 27/0629 | 257/49 |
| 2008/0203470 A1* | 8/2008 | Willmeroth | H01L 29/0634 | 257/328 |
| 2009/0008708 A1* | 1/2009 | Arai | H01L 29/402 | 257/330 |
| 2009/0014719 A1* | 1/2009 | Shimizu | H01L 27/0605 | 257/49 |
| 2010/0148244 A1* | 6/2010 | Kitabatake | H01L 24/06 | 257/328 |
| 2010/0219417 A1* | 9/2010 | Miura | H01L 29/0615 | 257/77 |
| 2011/0089486 A1* | 4/2011 | Xu | H01L 29/7813 | 257/330 |
| 2011/0278599 A1* | 11/2011 | Nakao | H01L 21/0465 | 257/77 |
| 2011/0284874 A1* | 11/2011 | Miura | H01L 29/0638 | 257/77 |
| 2012/0205669 A1* | 8/2012 | Miura | H01L 29/1095 | 257/77 |
| 2012/0217555 A1* | 8/2012 | Saito | H01L 29/1095 | 257/288 |
| 2012/0329216 A1* | 12/2012 | Dhar | H01L 21/049 | 438/135 |
| 2013/0020586 A1* | 1/2013 | Miura | H01L 29/0615 | 257/77 |
| 2013/0020587 A1* | 1/2013 | Hino | H01L 29/1095 | 257/77 |
| 2013/0168700 A1* | 7/2013 | Furukawa | H01L 29/7805 | 257/77 |
| 2013/0248994 A1 | 9/2013 | Ninomiya | | |
| 2014/0077232 A1* | 3/2014 | Hino | H01L 29/45 | 257/77 |
| 2014/0183620 A1* | 7/2014 | Takaya | H01L 29/42372 | 257/328 |
| 2014/0225114 A1* | 8/2014 | Furukawa | H01L 29/66068 | 257/48 |
| 2014/0291757 A1* | 10/2014 | Hirabayashi | H01L 29/7397 | 257/330 |
| 2014/0299891 A1* | 10/2014 | Hino | H01L 29/7396 | 257/77 |
| 2014/0353686 A1* | 12/2014 | Miura | H01L 29/0615 | 257/77 |
| 2015/0108501 A1* | 4/2015 | Iwamuro | H01L 29/1608 | 257/77 |
| 2015/0263000 A1* | 9/2015 | Kono | H01L 27/0733 | 257/300 |
| 2015/0263115 A1* | 9/2015 | Hiyoshi | H01L 29/402 | 257/77 |
| 2015/0303294 A1* | 10/2015 | Sakata | H01L 29/4238 | 257/330 |
| 2015/0325691 A1* | 11/2015 | Miyakoshi | H01L 29/42372 | 257/329 |
| 2015/0380401 A1* | 12/2015 | Ishii | H01L 21/76 | 257/140 |
| 2016/0043199 A1* | 2/2016 | Sumi | H01L 29/66712 | 438/268 |
| 2016/0126314 A1* | 5/2016 | Shimatou | H01L 29/0634 | 257/329 |
| 2016/0225855 A1* | 8/2016 | Hiyoshi | H01L 29/872 | |
| 2016/0225862 A1* | 8/2016 | Hara | H01L 29/404 | |
| 2016/0225891 A1* | 8/2016 | Hiyoshi | H01L 29/47 | |
| 2016/0254375 A1* | 9/2016 | Nakamura | H01L 29/404 | 257/144 |
| 2016/0260703 A1* | 9/2016 | Nakamura | H01L 29/404 | |
| 2016/0276443 A1* | 9/2016 | Kono | H01L 29/1608 | |
| 2017/0018547 A1* | 1/2017 | Naito | H01L 27/0664 | |
| 2017/0040423 A1* | 2/2017 | Inoue | H01L 29/42372 | |
| 2017/0077087 A1* | 3/2017 | Horikawa | H01L 29/78 | |
| 2017/0098705 A1* | 4/2017 | Harrington, III | H01L 29/7811 | |
| 2017/0125574 A1* | 5/2017 | Chowdhury | H01L 29/7787 | |
| 2017/0278824 A1* | 9/2017 | Sawada | H01L 23/48 | |
| 2017/0287828 A1* | 10/2017 | Sawada | H01L 23/48 | |
| 2017/0301788 A1* | 10/2017 | Fukui | H01L 23/482 | |
| 2017/0338337 A1* | 11/2017 | Bobde | H01L 29/407 | |
| 2018/0114843 A1* | 4/2018 | Saitoh | H01L 21/046 | |
| 2018/0138134 A1* | 5/2018 | Chikamatsu | H01L 23/645 | |
| 2018/0233563 A1* | 8/2018 | Hiyoshi | H01L 21/046 | |
| 2018/0315819 A1* | 11/2018 | Tanaka | H01L 29/78 | |
| 2018/0323294 A1* | 11/2018 | Okuda | H01L 29/739 | |
| 2018/0358431 A1* | 12/2018 | Kagawa | H01L 29/1045 | |

* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2016-235388, filed on Dec. 2, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, to reduce the ON resistance of an element in a power semiconductor device, a vertical metal oxide semiconductor field effect transistor (MOSFET) having a trench structure is produced (manufactured). In the vertical MOSFET, the trench structure in which a channel is formed orthogonal to a substrate surface enables the cell density per unit area to be increased more easily as compared to a planar structure in which the channel is formed parallel to the substrate surface. As a result, the current density per unit area may be increased which is advantageous in terms of cost.

Nonetheless, to form the channel in an orthogonal direction when a trench structure is formed in a vertical MOSFET, a structure is adopted in which an inner wall of the trench is entirely covered by a gate insulating film. A portion of the gate insulating film at a bottom of the trench is near a drain electrode and therefore, this portion of the gate insulating film is easily subjected to high electric field. In particular, since ultrahigh voltage elements are produced with a wide bandgap semiconductor material (semiconductor material having a wider bandgap than that of silicon such as silicon carbide (SiC)), adverse effects on the gate insulating film at the bottom of the trench significantly reduce reliability.

As a method of resolving such problems, a semiconductor device has been proposed in which in a vertical MOSFET of a trench structure having a striped planar pattern, a p-type region is formed so as to cover the bottom of the trench; an n-type current spreading layer is formed between a p-type base region and an n$^-$-type drift layer; and a p-type region contacting the base region and reaching the drift layer is formed between trenches (e.g., refer to Japanese Laid-Open Patent Publication Nos. 2011-192822 and 2013-201266).

FIG. 10 is a cross-sectional view of a structure of a conventional silicon carbide semiconductor device. An n$^-$-type silicon carbide epitaxial layer 102 is deposited on a front surface of an n$^+$-type silicon carbide substrate 101. On a surface of a first side of the n$^-$-type silicon carbide epitaxial layer 102 opposite a second side thereof facing the n$^+$-type silicon carbide substrate 101, an n-type region 105 that is an n-type current spreading layer (CSL) is provided. Further, in the surface layer on the first side of the n$^-$-type silicon carbide epitaxial layer 102, a p$^+$-type region 103 is selectively provided. In the n$^-$-type silicon carbide epitaxial layer 102, a second p$^+$-type region 104 is provided so as to cover a bottom of a trench 1018.

Further, in the conventional vertical MOSFET, a p-type base layer 106, an n$^{++}$-type source region 107, a p$^{++}$-type contact region 108, a gate insulating film 109, a gate electrode 1011, an interlayer insulating film 1012, a source electrode 1013, a rear electrode 1014, and the trench 1018 are provided. In FIG. 10, an active region 1020 is a region in which current flows in an ON state when an element structure is formed. A gate pad region 1040 is a region in which a gate electrode pad 1016 electrically connected to the gate electrode 1011 is provided. A connecting region 1030 is a region in which a gate runner (not depicted) connecting the gate electrode 1011 and a gate pad electrode 1016 is provided.

In the vertical MOSFET of the configuration in FIG. 10, a pn junction of the p$^+$-type region 103 and the n-type region 105 is at a position deeper than that of the trench 1018 whereby electric field concentrates at a boundary of the p$^+$-type region 103 and the n-type region 105 whereby mitigation of electric field concentration at the bottom of the trench 1018 becomes possible. Further, an n-type current spreading region is provided whereby the ON resistance is reduced and current flowing in the trench 1018 may be suppressed, enabling the breakdown voltage to be enhanced.

SUMMARY OF THE INVENTION

According to one aspect of the present invention, a semiconductor device includes a semiconductor substrate of a first conductivity type; a first epitaxial layer of the first conductivity type provided on a front surface of the semiconductor substrate; a first semiconductor region of the first conductivity type selectively provided in the first epitaxial layer, an impurity concentration of the first semiconductor region is higher than that of the first epitaxial layer; a second epitaxial layer of a second conductivity type provided on a first side of the first epitaxial layer opposite a second side of the first epitaxial layer facing the semiconductor substrate; a second semiconductor region of the first conductivity type selectively provided in the second epitaxial layer, an impurity concentration of the second semiconductor region is higher than that of the first epitaxial layer; a trench penetrating the second semiconductor region and the second epitaxial layer, the trench reaching the first semiconductor region; a gate electrode provided in the trench, via a gate insulating film; a first electrode contacting the second semiconductor region and the second epitaxial layer; a second electrode provided on a rear surface of the semiconductor substrate; and a gate electrode pad electrically connected to the gate electrode. The first semiconductor region is not provided beneath the gate electrode pad.

In the semiconductor device, the first semiconductor region is not provided in a lower portion of a connecting region connecting the gate electrode and the gate electrode pad.

The semiconductor device includes a third semiconductor region of the second conductivity type selectively provided in a surface of the first epitaxial layer and contacting the second epitaxial layer; and a fourth semiconductor region of the second conductivity type selectively provided in the first epitaxial layer, the fourth semiconductor region covering a bottom of the trench. An interface of the third semiconductor region and the first epitaxial layer in a region in which the first semiconductor region is not provided is closer than an interface of the third semiconductor region and the first semiconductor region, to the semiconductor substrate.

According to another aspect of the present invention, a method of manufacturing a semiconductor device includes forming a first epitaxial layer of a first conductivity type on a front surface of a semiconductor substrate of the first conductivity type; selectively forming a first semiconductor region of the first conductivity type in the first epitaxial layer, an impurity concentration of the first semiconductor region being higher than that of the first epitaxial layer; forming a second epitaxial layer of a second conductivity type on a first side of the first epitaxial layer opposite a second side of the first epitaxial layer facing the semiconductor substrate; selectively forming a second semiconductor region of the first conductivity type in the second epitaxial layer, an impurity concentration of the second semiconductor region being higher than that of the first epitaxial layer; forming a trench penetrating the second semiconductor region and the second epitaxial layer, the trench reaching the first semiconductor region; forming a gate electrode in the trench, via a gate insulating film; forming a first electrode contacting the second semiconductor region and the second epitaxial layer; forming a second electrode on a rear surface of the semiconductor substrate; and forming a gate electrode pad electrically connected to the gate electrode. In forming the first semiconductor region, the first semiconductor region is not formed beneath the gate electrode pad.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
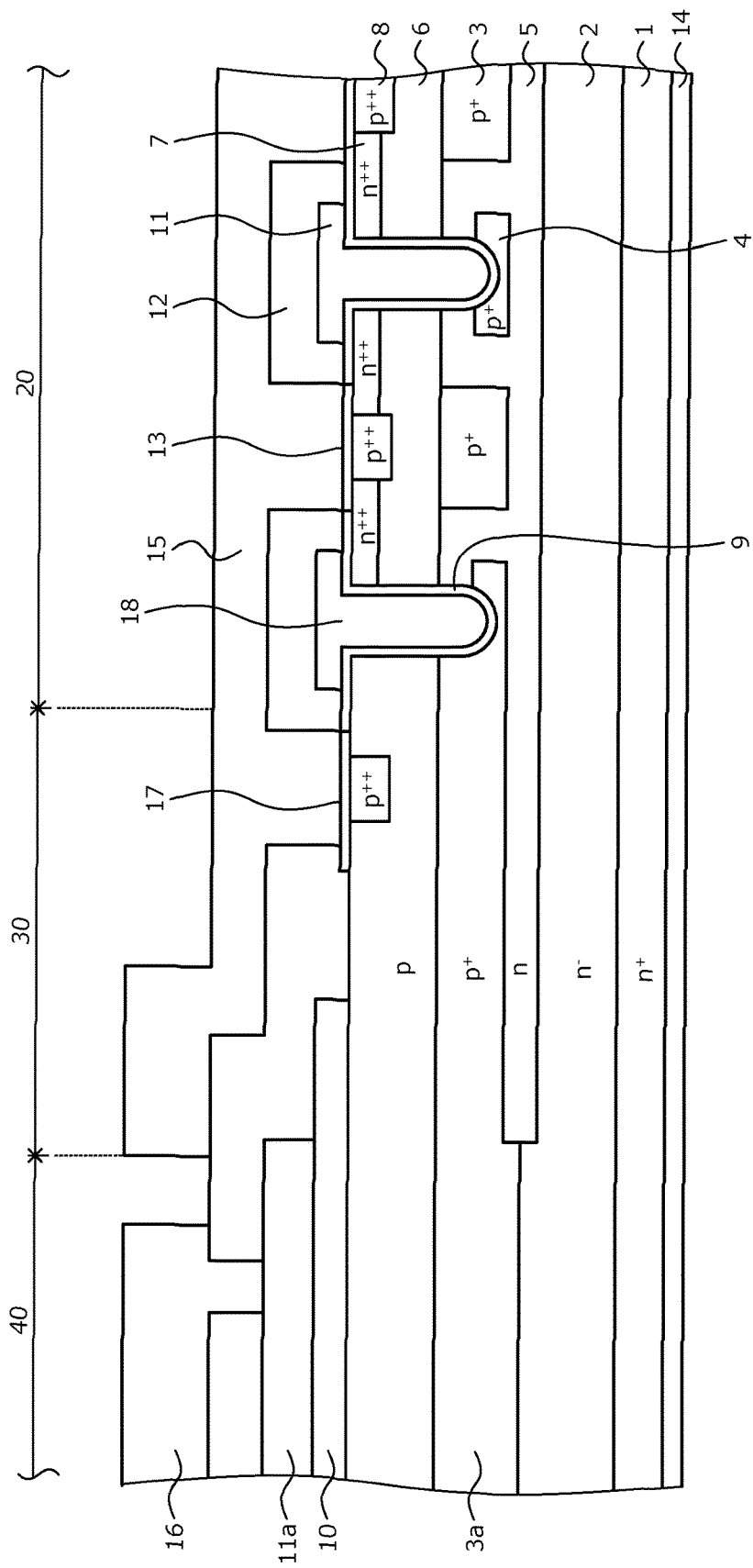
FIG. 1 is a cross-sectional view of a structure of a silicon carbide semiconductor device according to an embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without +or −. Cases where symbols such as n's and p's that include +or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

In the conventional silicon carbide semiconductor device above, the second p$^+$-type region 104 at the bottom of the trench 1018 and the p$^+$-type region 103 of the gate pad region 1040 are at about the same depth. Therefore, breakdown voltage for drain voltage in the second p$^+$-type region 104 and breakdown voltage for drain voltage in the p$^+$-type region 103 are substantially the same. As a result, the breakdown voltage of the p$^+$-type region 104 at the bottom of the trench 1018 may be less than the breakdown voltage of the p$^+$-type region 103. In this case, the breakdown voltage of the element overall is rate limited by the breakdown voltage of the trench 1018.

Therefore, avalanche breakdown occurs at the bottom of the trenches 1018 and as a result, carriers are injected to the gate insulating film 109 at the bottom of the trenches 1018. The injected carriers are trapped by a carrier trap in the gate insulating film 109 and modulate the local electric field in the gate insulating film 109. Further, due to changes of the local electric field, the local electric field becomes stronger, creating an unfavorable cycle in which carriers are further injected whereby the gate insulating film 109 may be destroyed.

The semiconductor device according to the present invention is formed using a wide bandgap semiconductor material. In the present embodiment, a silicon carbide semiconductor device produced using, for example, silicon carbide (SiC) as the wide bandgap semiconductor material is described taking a MOSFET as an example. FIG. 1 is a cross-sectional view of a structure of the silicon carbide semiconductor device according to the embodiment.

As depicted in FIG. 1, in the silicon carbide semiconductor device according to the embodiment, an n$^−$-type silicon carbide epitaxial layer (first epitaxial layer of the first conductivity type) 2 is deposited on a first main surface (front surface), for example, a (0001) plane (Si face) of an n$^+$-type silicon carbide substrate (semiconductor substrate of a first conductivity type) 1.

The n$^+$-type silicon carbide substrate 1 is a silicon carbide single-crystal substrate. The n$^−$-type silicon carbide epitaxial layer 2 has an impurity concentration that is lower than that of the n$^+$-type silicon carbide substrate 1 and, for example, is a low-concentration n-type drift layer. In a surface of a first side of the n$^−$-type silicon carbide epitaxial layer 2 opposite a second side of the n$^−$-type silicon carbide epitaxial layer 2 facing the n$^+$-type silicon carbide substrate 1, an n-type region (first semiconductor region of the first conductivity type) 5 that is a CSL region is selectively provided. The n-type region 5 is a high-concentration n-type drift layer having an impurity concentration that is higher than that of the n$^−$-type silicon carbide epitaxial layer 2 and lower than that of the n$^+$-type silicon carbide substrate 1. The n-type region 5 is constituted by a lower n-type region 5$a$ at a position deeper on a drain side than a bottom of a trench 18 described hereinafter and an upper n-type region 5$b$ at a position closer than the bottom of the trench 18, to a source side.

Here, the n-type region 5 is provided in an active region 20 and a connecting region 30, and is not provided in a gate pad region 40. For example, the n-type region 5 is not provided beneath a gate electrode pad 16 described hereinafter. Here, "beneath the gate electrode pad 16" is a portion in the gate pad region 40 closer than the gate electrode pad 16, to the n$^+$-type silicon carbide substrate 1.

Further, configuration may be such that the n-type region 5 is not provided in the connecting region 30. For example, configuration may be such that the n-type region 5 is not provided beneath the gate electrode pad 16 or beneath the source electrode pad 15 in the connecting region 30. Adoption of such a structure enables a concentration of an n-type impurity in the gate pad region 40 to be made lower than a concentration of an n-type impurity directly beneath a second p$^+$-type region 4. "Directly beneath the second p$^+$-type region 4" is a region of the n-type region 5 adjacent to the second p$^+$-type region 4 and the n$^-$-type silicon carbide epitaxial layer 2.

Further, an interface of a gate pad p$^+$-type region 3a described hereinafter and the n$^-$-type silicon carbide epitaxial layer 2 in a region in which the n-type region 5 is not provided may be at a position that is shallower than a position of an interface of the n-type region 5 and the n$^-$-type silicon carbide epitaxial layer 2. As a result, a pn junction of the gate pad p$^+$-type region 3a and the n$^-$-type silicon carbide epitaxial layer 2 in the region where the n-type region 5 is not provided may be positioned deeper than a pn junction of a p$^+$-type base region 3 and the n-type region 5 and a pn junction of the second p$^+$-type region 4 and the n-type region 5.

On the surface of the first side of the n$^-$-type silicon carbide epitaxial layer 2, a p-type base layer (second epitaxial layer of a second conductivity type) 6 is provided. The p-type base layer 6 contacts the p$^+$-type base regions 3 described hereinafter. Further, collectively the n$^+$-type silicon carbide substrate 1, the n$^-$-type silicon carbide epitaxial layer 2 and the p-type base layer 6 are regarded as a silicon carbide semiconductor base.

On a second main surface (rear surface, i.e., rear surface of the silicon carbide semiconductor base) of the n$^+$-type silicon carbide substrate 1, a rear electrode (second electrode) 14 that becomes a drain electrode is provided. On a surface of the rear electrode 14, a drain electrode pad (not depicted) is provided.

In first main surface side (the p-type base layer 6 side) of the silicon carbide semiconductor base, a trench structure is formed. In particular, each trench 18 penetrates the p-type base layer 6 from a surface of a first side of the p-type base layer 6 (first main surface side of the silicon carbide semiconductor base) opposite a second side of the p-type base layer 6 facing toward the n$^+$-type silicon carbide substrate 1 and reaches the n-type region 5. Along an inner wall of the trench 18, a gate insulating film 9 is formed at the bottom and sidewalls of the trench 18; a gate electrode 11 is formed on the gate insulating film 9 in the trench 18. The gate electrode 11 is insulated from the n$^-$-type silicon carbide epitaxial layer 2 and the p-type base layer 6 by the gate insulating film 9. A portion of the gate electrode 11 may protrude from above (side on which the source electrode pad 15 is provided) the trench 18 toward the source electrode pad 15.

In the surface of the first side of the n$^-$-type silicon carbide epitaxial layer 2 (first main surface side of the silicon carbide semiconductor base), the p$^+$-type base region (third semiconductor region of the second conductivity type) 3 is selectively provided. Each p$^+$-type base region 3 reaches a position deeper on the drain side than the bottom of the trench 18. A lower end (end on drain side) of the p$^+$-type base region 3 is positioned deeper on the drain side than the bottom of the trench 18. Among the p$^+$-type base regions 3, the p$^+$-type base regions 3 in the gate pad region 40, i.e., a p$^+$-type base region 3 under the gate electrode pad 16, is called the gate pad p$^+$-type region 3a.

Further, in the n$^-$-type silicon carbide epitaxial layer 2, a second p$^+$-type region (fourth semiconductor region of the second conductivity type) 4 is selectively provided. The second p$^+$-type region 4 is provided so as to contact the bottom of the trench 18. Each second p$^+$-type region 4 is provided at a depth not reaching the interface of the n-type region 5 and the n$^-$-type silicon carbide epitaxial layer 2, from a position deeper on the drain side than an interface of the p-type base layer 6 and the n-type region 5.

Providing the second p$^+$-type region 4 enables formation of the pn junction of the second p$^+$-type region 4 and the n-type region 5 at a position near the bottom of the trench 18 in a depth direction (on the n$^+$-type silicon carbide substrate 1 side). Formation of the pn junction of the second p$^+$-type region 4 and the n-type region 5 in this manner enables an application of high electric field to the gate insulating film 9 at the bottom of the trench 18 to be prevented. Therefore, even when a wide bandgap semiconductor material is used as a semiconductor material, high breakdown voltages become possible. Further, by providing the second p$^+$-type region 4, which has a larger width than that of the trench, the electric field at a corner portion of the bottom of the trench 18 where electric field concentrates may be mitigated whereby the breakdown voltage may be further increased.

In the p-type base layer 6, in the first main surface side of the silicon carbide semiconductor base, a n$^{++}$-type source region (second semiconductor region of the first conductivity type) 7 and a p$^{++}$-type contact region 8 are selectively provided. Further, the n$^{++}$-type source region 7 and the p$^{++}$-type contact region 8 contact each other. The p$^{++}$-type contact region 8 may be formed at a same depth as the n$^{++}$-type source region 7 or may be formed deeper than the n$^{++}$-type source region 7.

An interlayer insulating film 12 is provided on the entire surface of the first main surface side of the silicon carbide semiconductor base, so as to cover the gate electrodes 11 embedded in the trenches 18. A source electrode (first electrode) 13 contacts the n$^{++}$-type source region 7 and the p$^{++}$-type contact region 8, via a contact hole opened in the interlayer insulating film 12. The source electrode 13 is electrically insulated from the gate electrode 11 by the interlayer insulating film 12. On each source electrode 13, the source electrode pad 15 is provided.

Further, in the gate pad region 40, on the first main surface side of the silicon carbide semiconductor base (the p-type base layer 6 side), a field oxide film 10 is provided. On an upper side of the field oxide film 10, a gate-pad gate electrode 11a is provided and on the gate-pad gate electrode 11a, the gate electrode pad 16 is provided.

In FIG. 1, although only two cells (each being a structure including the trench 18, the gate insulating film 9, the gate electrode 11, the interlayer insulating film 12, and the source electrode 13) are depicted, more metal oxide film semiconductor (MOS) gate structures may be arranged in parallel.

The method of manufacturing a silicon carbide semiconductor device according to the embodiment is described. FIGS. 2, 3, 4, 5, 6, 7, 8 and 9 are cross-sectional views of the silicon carbide semiconductor device during manufacture according to the embodiment. First, the n$^+$-type silicon carbide substrate 1 containing an n-type silicon carbide is prepared. On a first main surface of the n$^+$-type silicon carbide substrate 1, while an n-type impurity, for example, nitrogen atoms (N) is doped, the n$^-$-type silicon carbide epitaxial layer 2 containing silicon carbide is formed by epitaxial growth to have, for example, an impurity concentration of $8.0\times10^{15}/cm^3$ and a thickness of about 10 μm.

Figure 2:
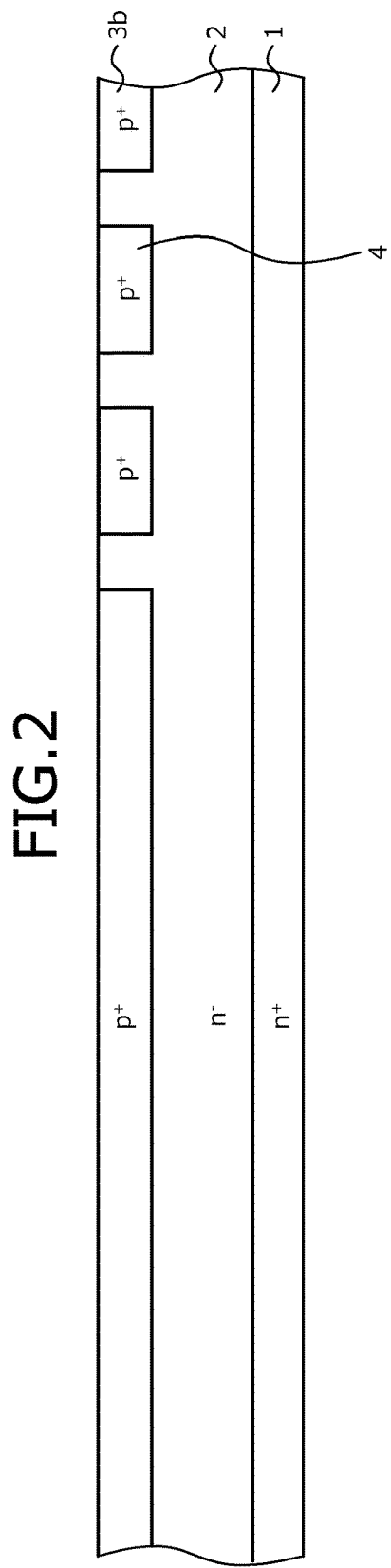
FIGS. 2, 3, 4, 5, 6, 7, 8 and 9 are cross-sectional views of the silicon carbide semiconductor device during manufacture according to the embodiment.

Next, on the surface of the n$^-$-type silicon carbide epitaxial layer 2, a mask (not depicted) having desired openings is formed by a photolithography technique, for example, using an oxide film. Using the oxide film as a mask, a p-type impurity, for example, aluminum ions (Al), is ion implanted. As a result, in the surface layer of the n$^-$-type silicon carbide epitaxial layer 2, for example, each second p$^+$-type region 4 and lower p$^+$-type regions 3b at a depth of about 0.5 μm are formed. The state up to here is depicted in FIG. 2.

Figure 3:
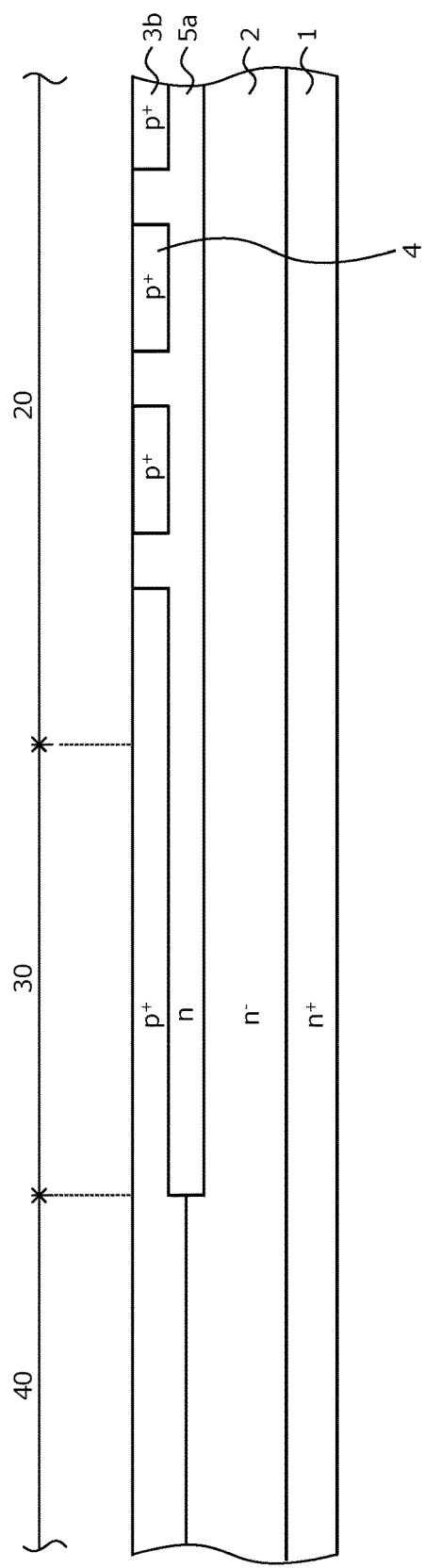

Next, the mask used in the ion implantation for forming the lower $p^+$-type regions $3b$ and each second $p^+$-type region 4 is removed. On the surface of the $n^-$-type silicon carbide epitaxial layer 2, a mask (not depicted) having desired openings is formed by a photolithography technique, for example, using an oxide film. Using the oxide film as a mask, an n-type impurity, for example, nitrogen atoms, is ion implanted in regions of the active region 20 and the connecting region 30. As a result, in regions of the active region 20 and the connecting region 30 of the surface layer of the $n^-$-type silicon carbide epitaxial layer 2, the lower n-type region $5a$ is formed at a depth of, for example, about 0.7 µm or less. The state up to here is depicted in FIG. 3. Further, in cases when the n-type region 5 is not to be provided in the connecting region 30, the n-type impurity, for example, nitrogen atoms, is ion implanted in a region of the active region 20 only.

In regions of the active region 20 and the connecting region 30, since the n-type impurity is implanted, thicknesses of the lower $p^+$-type regions $3b$ and each second $p^+$-type region 4 are thinner than a thickness of the lower $p^+$-type region $3b$ of the gate pad region 40. As a result, an interface of the gate pad $p^+$-type region $3a$ and the $n^-$-type silicon carbide epitaxial layer 2 is at a position shallower than that of the interface of the n-type region 5 and the $n^-$-type silicon carbide epitaxial layer 2.

Figure 4:
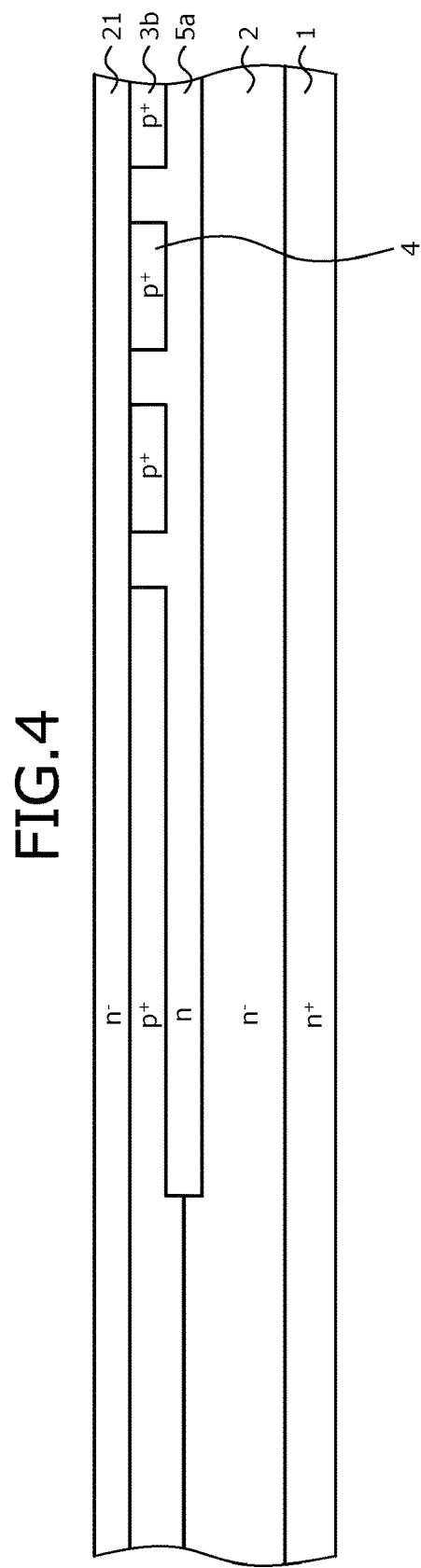

Next, the mask used in the ion implantation for forming the lower n-type region $5a$ is removed. On surfaces of the lower n-type region $5a$, the lower $p^+$-type regions $3b$, and the second $p^+$-type regions 4, while an n-type impurity, for example, nitrogen atoms, is doped, an $n^-$-type region 21 that contains silicon carbide and becomes the upper n-type region $5b$ is formed by epitaxial growth to have, for example, an impurity concentration of $8.0 \times 10^{15}/\text{cm}^3$ and a thickness of about 0.5 µm. The state up to here is depicted in FIG. 4.

Figure 5:
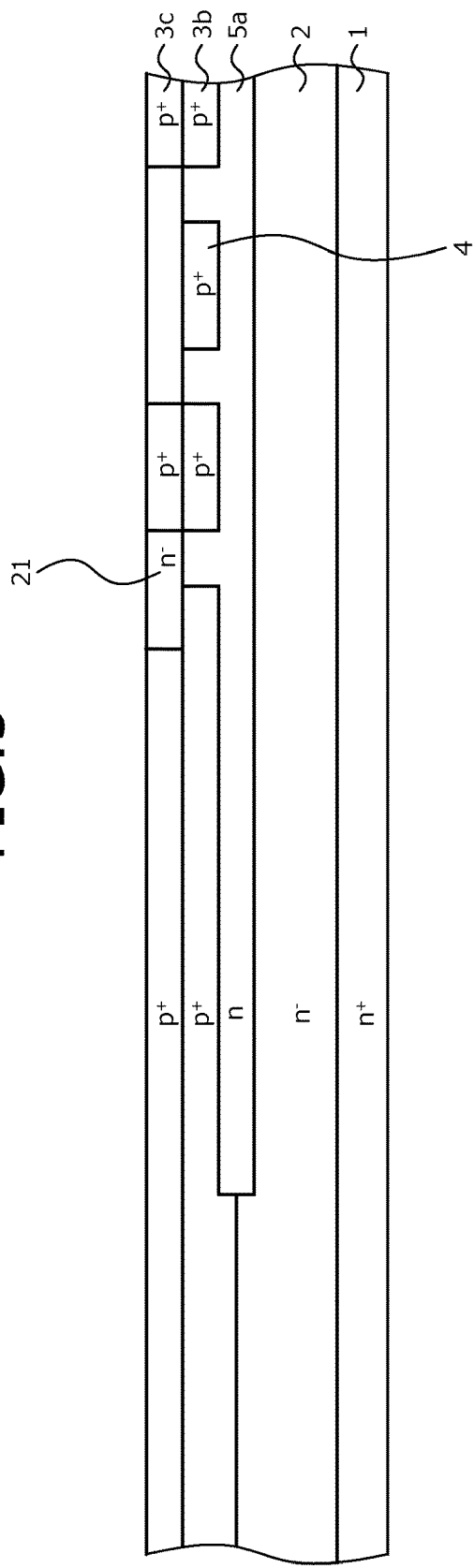

Next, on the surface of the $n^-$-type region 21, a mask (not depicted) having desired openings is formed by a photolithography technique, for example, using an oxide film. Using the oxide film as a mask, a p-type impurity, for example, aluminum ions, is ion implanted. As a result, in a portion of the type region 21 of the surface layer of the $n^-$-type silicon carbide epitaxial layer 2, upper $p^+$-type regions $3c$ are formed. The upper $p^+$-type regions $3c$ and the lower $p^+$-type regions $3b$ combined become the $p^+$-type base regions 3. The state up to here is depicted in FIG. 5.

Figure 6:
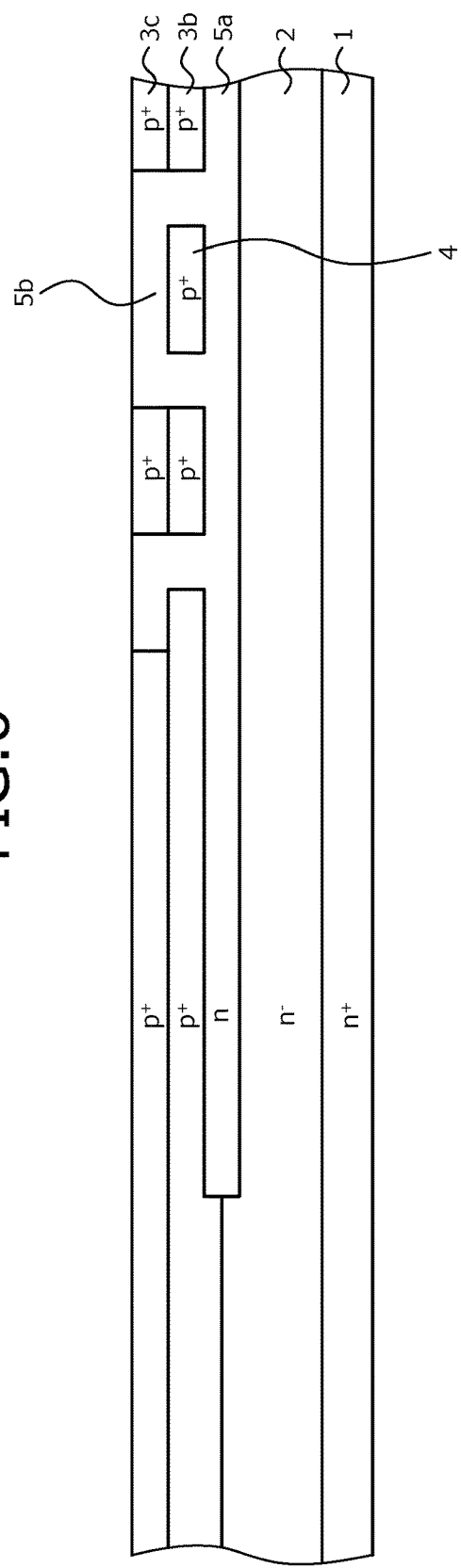

Next, the mask used in the ion implantation for forming the upper $p^+$-type regions $3c$ is removed. On the surface of the $n^-$-type silicon carbide epitaxial layer 2, a mask (not depicted) having desired openings is formed by a photolithography technique, for example, using an oxide film. Using the oxide film as a mask, an n-type impurity, for example, nitrogen atoms, are ion implanted. As a result, the $n^-$-type regions 21 are changed to an n-type, forming the upper n-type regions $5b$. The upper n-type regions $5b$ and the lower n-type region $5a$ combined become the n-type region 5. The state up to here is depicted in FIG. 6.

Next, the mask used in the ion implantation for forming the upper n-type regions $5b$ is removed. On the surface (i.e., surfaces of the upper $p^+$-type base regions $3c$ and the upper n-type regions $5b$) of the $n^-$-type silicon carbide epitaxial layer 2, while a p-type impurity, for example, aluminum ions, is doped, the p-type base layer 6 is formed by epitaxial growth to have, for example, a thickness of about 1.3 µm. A condition of the epitaxial growth for forming the p-type base layer 6, for example, may be set such that the impurity concentration becomes about $1.5 \times 10^{17}/\text{cm}^3$, which is lower than the impurity concentration of the $p^+$-type base region 3. By the processes up to here, the silicon carbide semiconductor base is formed in the $n^-$-type silicon carbide epitaxial layer 2 and the p-type base layer 6 are stacked on the $n^+$-type silicon carbide substrate 1.

Next, on the surface of the p-type base layer 6, a mask (not depicted) having desired openings is formed by a photolithography technique, for example, using an oxide film. Using the oxide film as a mask, an n-type impurity, for example, phosphorus (P) is ion implanted. As a result, in a portion of the surface layer of the p-type base layer 6, the $n^{++}$-type source regions 7 are formed having, for example, a thickness of about 0.3 µm. A dose for the ion implantation for forming the $n^{++}$-type source regions 7 may be set so that, for example, the impurity concentration becomes higher than that of the $n^+$-type silicon carbide substrate 1.

Figure 7:
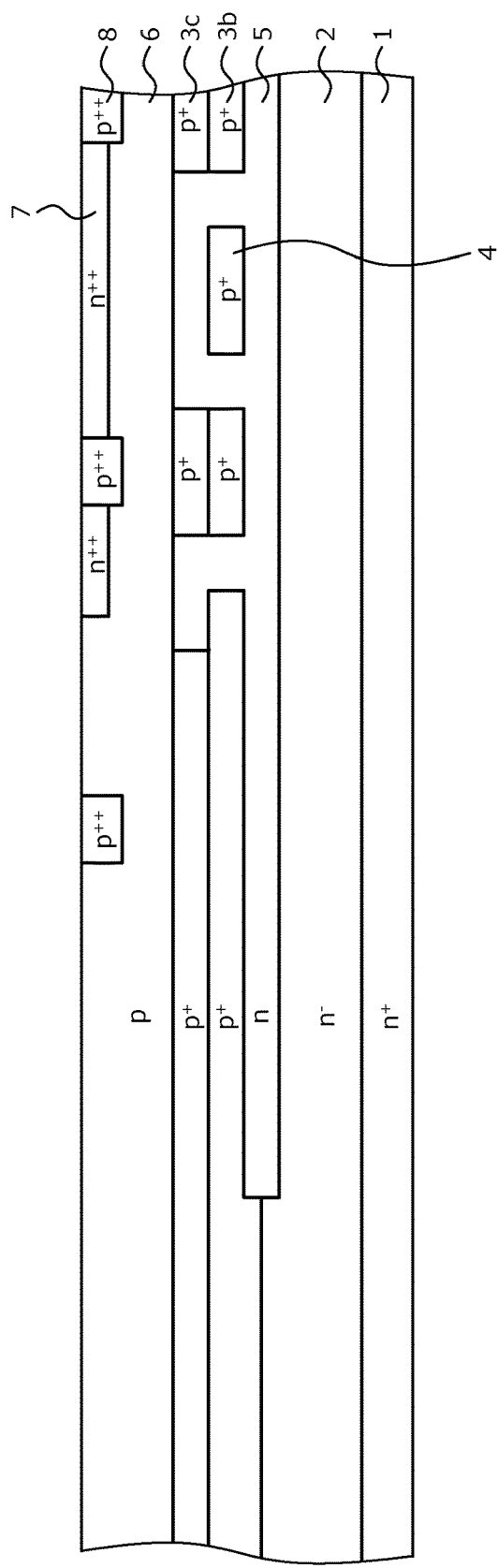

Next, the mask used in the ion implantation for forming the $n^{++}$-type source regions 7 is removed. On the surface of the p-type base layer 6, a mask (not depicted) having desired openings is formed by a photolithography technique, for example, using an oxide film. Using the oxide mask as a mask, a p-type impurity, for example, aluminum, is ion implanted in the surface of the p-type base layer 6. As a result, in portions of a surface region of the p-type base layer 6, the $p^{++}$-type contact regions 8 are formed at a depth of about 0.5 µm. A dose for ion implantation for forming the $p^{++}$-type contact regions 8 may be set so that, for example, the impurity concentration becomes higher than that of the p-type base layer 6. Subsequently, the mask used in the ion implantation for forming the $p^{++}$-type contact regions 8 is removed. The sequence in which the ion implantation for forming the $n^+$-type source regions 7 and the ion implantation for forming the $p^{++}$-type contact regions 8 are performed may be interchanged. The state up to here is depicted in FIG. 7.

Next, heat treatment (annealing) is performed, for example, to activate the $p^+$-type base regions 3, the second $p^+$-type regions 4, the n-type region 5, the $n^{++}$-type source regions 7, and the $p^{++}$-type contact regions 8. A temperature of the heat treatment may be, for example, about 1700 degrees C. A period of the heat treatment may be, for example, about 3 minutes. The ion implanted regions may be collectively activated by one session of the heat treatment as described or the heat treatment may be performed each time ion implantation is performed.

Figure 8:
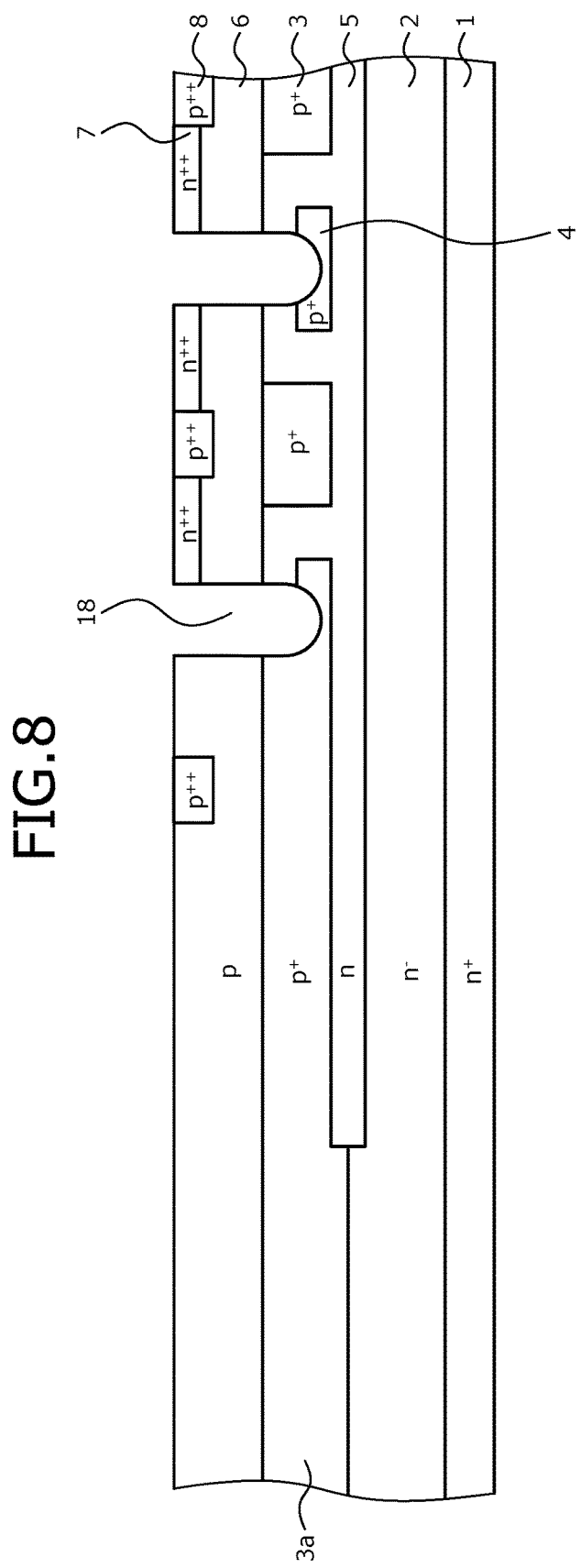

Next, on the surface (i.e., surfaces of the $n^{++}$-type source regions 7 and the $p^{++}$-type contact regions 8) of the p-type base layer 6, a mask (not depicted) having desired openings is formed by a photolithography technique, for example, using an oxide film. Using the oxide film as a mask, the trenches 18 are formed by dry etching, etc. so as to penetrate the $n^{++}$-type source regions 7 and the p-type base layer 6, and reach the n-type region 5. The bottom of each trench 18 reaches a second $p^+$-type region 4. Next, isotropic etching to remove damage of the trench 18 and hydrogen annealing to chamfer corners of the bottom of the trench 18 and the opening of the trench 18, etc. may be performed. Any one of isotropic etching and hydrogen annealing may be performed. Further, hydrogen annealing may be performed after isotropic etching. The hydrogen annealing, for example, is performed at 1500 degrees C. Subsequently, the mask used to form the trenches 18 is removed. The state up to here is depicted in FIG. 8.

Next, on the surface (i.e., surfaces of the $n^{++}$-type source regions 7 and the $p^{++}$-type contact regions 8) of the p-type base layer 6, for example, an oxide film having a thickness of 0.7 µm is deposited by chemical vapor deposition (CVD)

and a portion of the oxide film is removed by photolithography and wet etching to form the field oxide film 10.

Next, along the surfaces of the $n^{++}$-type source regions 7 and the $p^{++}$-type contact regions 8 and along the bottom and sidewalls of the trenches 18, the gate insulating film 9 is formed. The gate insulating film 9 may be formed by thermal oxidation by heat treatment at a temperature of about 1000 degrees C. in an oxygen atmosphere. Further, the gate insulating film 9 may be formed by a method of using a chemical reaction such as a high temperature oxide (HTO) process for deposition.

Next, on the gate insulating film 9, for example, a polycrystalline silicon layer doped with phosphorus ions is formed. The polycrystalline silicon layer is formed so as to be embedded in the trench 18. The polycrystalline silicon layer is patterned, leaving the polycrystalline silicon layer in the trench 18 whereby the gate electrode 11 is formed. A portion of the gate electrode 11 may protrude from above (side on which the source electrode pad 15 is provided) the trench 18 toward the source electrode pad 15.

Next, the interlayer insulating film 12 is formed so as to cover the gate insulating film 9 and the gate electrode 11. The interlayer insulating film 12 may be formed by, for example, none-doped silicate glass (NSG), phosphosilicate glass (PSG), borophosphosilicate glass (BPSG), high temperature oxide (HTO), or a combination thereof. Next, the interlayer insulating film 12 and the gate insulating film 9 are patterned to form contact holes, for example, a connecting region contact hole 17, whereby the $n^{++}$-type source region 7 and the $p^{++}$-type contact region 8 are exposed. Thereafter, heat treatment (reflow) is performed to planarize the interlayer insulating film 12.

Next, in the contact holes and on the interlayer insulating film 12, a conductive film that becomes the source electrode 13 is formed. The conductive film is selectively removed so that, for example, the source electrode 13 remains only in the contact holes.

Figure 9:
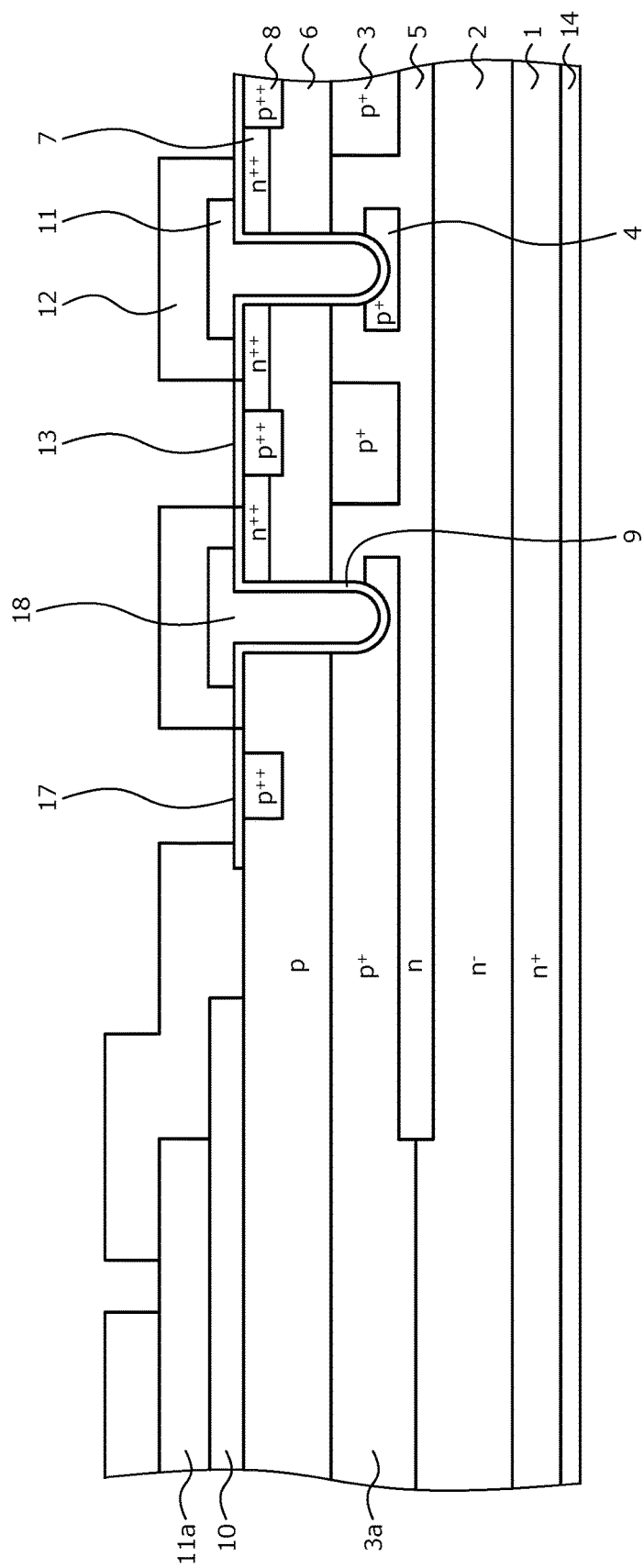
Figure 10:
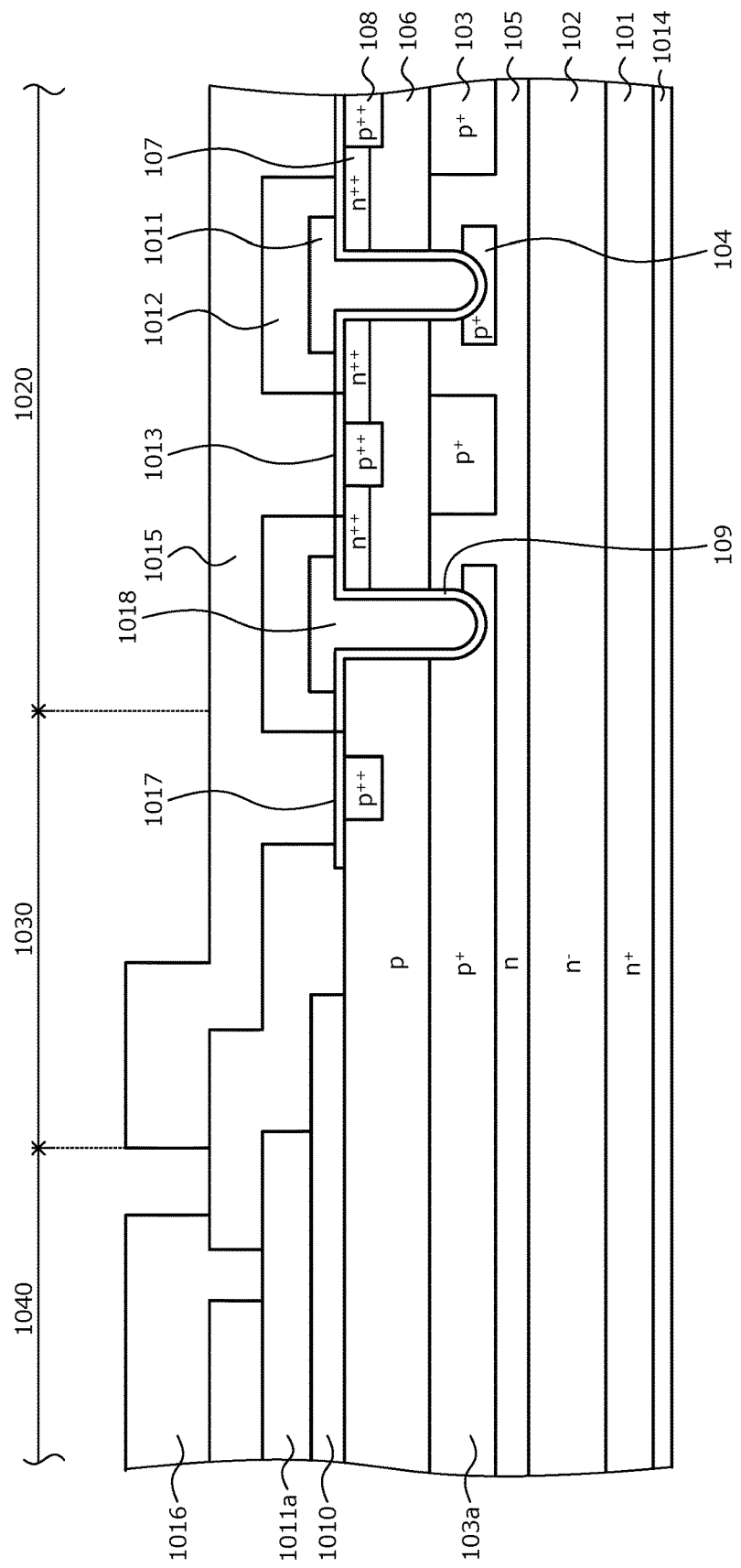
FIG. 10 is a cross-sectional view of a structure of a conventional silicon carbide semiconductor device.

Next, on the second main surface of the $n^+$-type silicon carbide substrate 1, the rear electrode 14 is formed using, for example, a nickel (Ni) film. Thereafter, for example, heat treatment at a temperature of about 970 degrees C. is performed, forming an ohmic junction of the $n^+$-type silicon carbide substrate 1 and the rear electrode 14. The state up to here is depicted in FIG. 9.

Next, for example, titanium (Ti), titanium nitride (TiN), titanium, and aluminum are sequentially deposited by, for example, a sputtering method, so as to cover the source electrode 13 and the interlayer insulating film 12 and are selectively removed thereafter so that a portion covering the active region 20 and the connecting region 30 of the element overall remains, forming the source electrode pad 15, and a portion covering the gate pad region 40 remains, forming the gate electrode pad 16.

Next, on the surface of the rear electrode 14, for example, titanium (Ti), nickel, and gold (Au) are sequentially deposited whereby a rear electrode pad (not depicted) is formed. Thus, the silicon carbide semiconductor device depicted in FIG. 1 is completed.

As described, the silicon carbide semiconductor device according to the embodiment does not provide the n-type region (first semiconductor region of the first conductivity type) beneath the active region, enabling the concentration of the n-type impurity in the lower portion of the gate pad region to be made lower than the concentration of the n-type impurity directly beneath the second $p^+$-type region (fourth semiconductor region of the second conductivity type). As a result, the site that rate limits the element breakdown voltage may be set to be a lower portion of the gate pad region and not the second $p^+$-type regions at the bottom of the trenches. In other words, the breakdown voltage of the second $p^+$-type region may be made higher than the breakdown voltage of the lower portion of the gate pad region.

Therefore, avalanche breakdown may be caused to selectively occur in the lower portion of the gate pad region, enabling the occurrence of avalanche breakdown to under the trenches to be suppressed. Therefore, for example, modulation of local electric field in the gate insulating film due to carrier injection to the gate insulating film at the bottom of the trench, dielectric breakdown of the gate insulating film, etc. may be prevented.

Further, according to the silicon carbide semiconductor device according to the embodiment, the interface of the gate pad $p^+$-type region (third semiconductor region of the second conductivity type) and the $n^-$-type silicon carbide epitaxial layer (first epitaxial layer of the first conductivity type) is shallower than the interface of the n-type region and the $n^-$-type silicon carbide epitaxial layer. Therefore, the pn junction in the region in which the n-type region is not provided may be positioned deeper than the pn junction of the $p^+$-type region and the n-type region and the pn junction of the second $p^+$-type region and the n-type region. Therefore, application of high electric field to the gate insulating film at the bottom of the trench is prevented, enabling a high breakdown voltage.

The present invention may be variously modified within a scope not departing from the spirit of the invention. For example, in the embodiments, dimensions, impurity concentrations, etc. of regions may be set according to required specifications. Further, in the embodiments, although a MOSFET has been described as an example, without limitation hereto, the present invention is widely applicable to silicon carbide semiconductor devices that conduct and block current by gate driving control based on a predetermined gate threshold voltage. For example, use of a semiconductor substrate of a conductivity type differing from the MOSFET, enables application to an insulated gate bipolar transistor (IGBT). Further, in the embodiments, although a case in which silicon carbide is used as a wide bandgap semiconductor material has been described has an example, other than silicon carbide, a wide bandgap semiconductor material such as gallium nitride (GaN) may be applied. In the embodiments, although the first conductivity type is assumed as an n-type and the second conductivity type is assumed as a p-type, the present invention is similarly implemented when the first conductivity type is a p-type and the second conductivity type is an n-type.

The semiconductor device according to the present invention and the method of manufacturing a semiconductor device achieve an effect in that the occurrence of avalanche breakdown at the bottom of the trenches may be suppressed.

Thus, the semiconductor device according to the present invention and the method of manufacturing a semiconductor device are useful for power semiconductor devices used in power converting equipment and power supply devices such as in various industrial machines and are particularly suitable for silicon carbide semiconductor devices of a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
a semiconductor substrate of a first conductivity type;
a first epitaxial layer of the first conductivity type provided on a front surface of the semiconductor substrate;
a first semiconductor region of the first conductivity type selectively provided in the first epitaxial layer, an impurity concentration of the first semiconductor region being higher than that of the first epitaxial layer;
a second epitaxial layer of a second conductivity type provided on a first side of the first epitaxial layer opposite a second side of the first epitaxial layer facing the semiconductor substrate;
a second semiconductor region of the first conductivity type selectively provided in the second epitaxial layer, an impurity concentration of the second semiconductor region being higher than an impurity concentration of the first epitaxial layer;
a trench penetrating the second semiconductor region and the second epitaxial layer, the trench reaching the first semiconductor region;
a gate electrode provided in the trench, via a gate insulating film;
a first electrode contacting the second semiconductor region and the second epitaxial layer;
a second electrode provided on a rear surface of the semiconductor substrate; and
a gate electrode pad electrically connected to the gate electrode, wherein
the first semiconductor region is not provided beneath the gate electrode pad.

2. The semiconductor device according to claim 1, wherein
the first semiconductor region is not provided in a lower portion of a connecting region connecting the gate electrode and the gate electrode pad.

3. The semiconductor device according to claim 1, comprising:
a third semiconductor region of the second conductivity type selectively provided in a surface of the first epitaxial layer and contacting the second epitaxial layer; and
a fourth semiconductor region of the second conductivity type selectively provided in the first epitaxial layer, the fourth semiconductor region covering a bottom of the trench, wherein
an interface of the third semiconductor region and the first epitaxial layer in a region in which the first semiconductor region is not provided is closer than an interface of the third semiconductor region and the first semiconductor region, to the semiconductor substrate.

4. A semiconductor device comprising:
a semiconductor substrate of a first conductivity type;
a first epitaxial layer of the first conductivity type provided on a front surface of the semiconductor substrate;
a first semiconductor region of the first conductivity type selectively provided in the first epitaxial layer, an impurity concentration of the first semiconductor region being higher than that of the first epitaxial layer;
a second epitaxial layer of a second conductivity type provided on a first side of the first epitaxial layer opposite a second side of the first epitaxial layer facing the semiconductor substrate;
a second semiconductor region of the first conductivity type selectively provided in the second epitaxial layer, an impurity concentration of the second semiconductor region being higher than an impurity concentration of the first epitaxial layer;
a trench penetrating the second semiconductor region and the second epitaxial layer, the trench reaching the first semiconductor region;
a gate electrode provided in the trench, via a gate insulating film;
a first electrode contacting the second semiconductor region and the second epitaxial layer;
a second electrode provided on a rear surface of the semiconductor substrate; and
a gate electrode pad electrically connected to the gate electrode, wherein
in a cross-sectional view, an end of the first semiconductor region closest to a connecting region connecting the gate electrode and the gate electrode pad is separated, in a direction substantially parallel to the front surface of the semiconductor substrate, from an end of the gate electrode pad closest to the connecting region.

* * * * *